(12) United States Patent
Cha

(10) Patent No.: US 6,740,572 B2
(45) Date of Patent: May 25, 2004

(54) METHOD FOR FABRICATING CMOS TRANSISTOR OF A SEMICONDUCTOR DEVICE

(75) Inventor: Jae-han Cha, Cheongju (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 0 days.

(21) Appl. No.: 10/331,529

(22) Filed: Dec. 30, 2002

(65) Prior Publication Data

US 2004/0005751 A1 Jan. 8, 2004

(30) Foreign Application Priority Data

Jul. 5, 2002 (KR) .......................................... 2002-38980

(51) Int. Cl.⁷ .......................................... H01L 21/3205
(52) U.S. Cl. ....................................................... 438/585
(58) Field of Search .................................. 438/585, 199

(56) References Cited

U.S. PATENT DOCUMENTS 6,127,251 A * 10/2000 Gardener et al. ........... 438/585

OTHER PUBLICATIONS

"Silicon Processing for the VLSI ERA", vol. 3: The Submicron Mosfet, Stanley Wolf Ph.D., Lattice Press, Sunset Beach, CA, 1984, pp. 591–598.

* cited by examiner

Primary Examiner—David Nelms
Assistant Examiner—Quoc Hoang
(74) Attorney, Agent, or Firm—Marshall, Gerstein & Borun LLP

(57) ABSTRACT

A method for fabricating a complementary metal oxide semiconductor (CMOS) of a semiconductor device includes the steps of: performing an implant process to a semiconductor substrate to form N-well and P-well; patterning a gate oxide layer, a gate electrode and an etching stop layer on the semiconductor substrate formed on the semiconductor substrate sequentially; depositing a gate oxide layer and an insulating layer having a high etching ratio on the semiconductor substrate; etching the insulating layer to form a side wall spacer and to form a source/drain through an implant process; removing the gate oxide layer placed around a gate edge through a wet etching; and depositing an interlayer insulating layer on the semiconductor substrate. The method is capable of preventing a gate from deteriorating by removing a gate oxide layer at a gate edge region by processing anisotropic wet etching after a gate formation of the CMOS and a source/drain formation processes.

2 Claims, 3 Drawing Sheets

METHOD FOR FABRICATING CMOS TRANSISTOR OF A SEMICONDUCTOR DEVICE

BACKGROUND OF THE INVENTION

1. Field of the Invention

The present invention relates to a method for fabricating complementary metal oxide semiconductor (CMOS) transistor of a semiconductor device; and, more particularly, to a method for fabricating a CMOS transistor of a semiconductor device capable of preventing a gate from deteriorating by removing the gate oxide layer at the gate edge region by processing anisotropic wet etching after gate formation of the CMOS and source/drain formation processes are finished.

2. Description of the Related Art

Generally, a complementary metal oxide semiconductor (CMOS) transistor is composed of a P-channel metal oxide semiconductor (PMOS) with superior power consumption and a N-channel metal oxide semiconductor (NMOS) capable of high speed operation, a low degree of integration and a complex manufacturing process. However, it does have excellent power consumption.

Recently, the size of semiconductor devices has decreased and a high degree of integration with new semiconductor technology. Therefore, the active area is decreased by the higher integration of the semiconductor device as well as the resulting increase in the threshold voltage.

FIG. 1 is a cross-sectional view showing a NMOS transistor with a lightly doped drain (LDD) structure formed in accordance with a prior art.

As shown in FIG. 1, after a device isolation layer 11 is formed on a semiconductor substrate 10, a gate oxide layer 12, a gate electrode 13 and an etching stop layer 14 are deposited onto the device isolation layer 11 and the semiconductor substrate 10. Thereafter, a gate is formed thereon and a side wall spacer 15 is formed on a side wall of the gate.

In a following step, after the formation of the gate, a light oxidation process is performed to alleviate the plasma damage of the gate oxide layer 12. After an NMOS LDD photomasking process and an implant process are performed, an interlayer insulating layer 16 is deposited thereon.

At this time, as shown in the drawing, the highest N+ source/drain concentration is approximately $10^{17}$, N-LDD concentration of approximately $10^{18}$ and an N-channel concentration is approximately $10^{17}$.

In such a concentration distribution, a space charge area between the P-well and the source/drain forms inclining toward the channel.

Although such an LLD structure in accordance with a prior art can minimize a hot carrier effect, it requires twice the amount of photomasking and implant processes during manufacturing increasing costs as well as reducing the channel length by dopants diffused toward the gate following a thermal process.

SUMMARY OF THE INVENTION

It is an object of the present invention to solve the above mentioned problems of the conventional method for manufacturing a semiconductor device and to provide a method for fabricating a CMOS transistor of a semiconductor device capable of preventing a gate oxide layer from a hot carrier by generating a void by forming an interlayer insulating layer after the gate oxide layer at a gate edge region is removed through a wet etching process, after a source/drain is formed by an implant process by using a gate sidewall spacer by omitting an LDD photomasking and an implant processes.

In accordance with a first embodiment of the present invention, there is provided a method for fabricating a complementary metal oxide semiconductor (CMOS) of a semiconductor device, including the steps of: forming a device isolation layer in a semiconductor substrate; performing an implant process to the semiconductor substrate to form an N-well and P-well; forming a gate oxide layer, a gate electrode and an etching stop layer on the semiconductor substrate sequentially; patterning the gate electrode and the etching stop layer into a predetermined configuration; depositing a gate oxide layer and an insulating layer having a high etching ratio on the patterned etching stop layer and a portion of the semiconductor substrate which is not covered by the patterned etching stop layer; etching the insulating layer to form a side wall spacer and to form a source/drain through an implant process; removing the gate oxide layer positioned around a gate edge through a wet etching process by using the side wall spacer and the etching stop layer as an etching barrier layer; and depositing an interlayer insulating layer on the patterned etching stop layer, the side wall spacer and a portion of the semiconductor substrate which is not covered with the patterned etching stop layer and the side wall spacer.

In accordance with another aspect of the present invention, there is provided a method for manufacturing a semiconductor device, wherein after the oxidation layer of the gate edge portion is etched, and a light oxidation process is performed.

In accordance with a second embodiment of the present invention, there is provided a method for fabricating a complementary metal oxide semiconductor (CMOS) of a semiconductor device, including the steps of: forming a device isolation layer in a semiconductor substrate; performing an implant process to the semiconductor substrate to form an N-well and P-well; forming a gate oxide layer and a gate electrode on the semiconductor substrate sequentially; patterning the gate electrode and the gate oxide layer into a predetermined configuration; removing the gate oxide layer placed at an edge portion of a gate by the wet etching; forming an insulting layer on the patterned gate electrode and a portion of the semiconductor substrate; forming a side wall spacer on a side wall of the patterned gate electrode by etching the insulating layer; and forming a source/drain in the semiconductor substrate through an implant process.

In accordance with another aspect of the present invention, there is provided a method for manufacturing a semiconductor device, wherein the insulating layer has a high etching ratio.

BRIEF DESCRIPTION OF DRAWINGS

Other objects and aspects of the present invention will become apparent from the following description of embodiments with reference to the accompanying drawings in which.

DESCRIPTION OF THE PREFERRED EMBODIMENT

Figure 1:
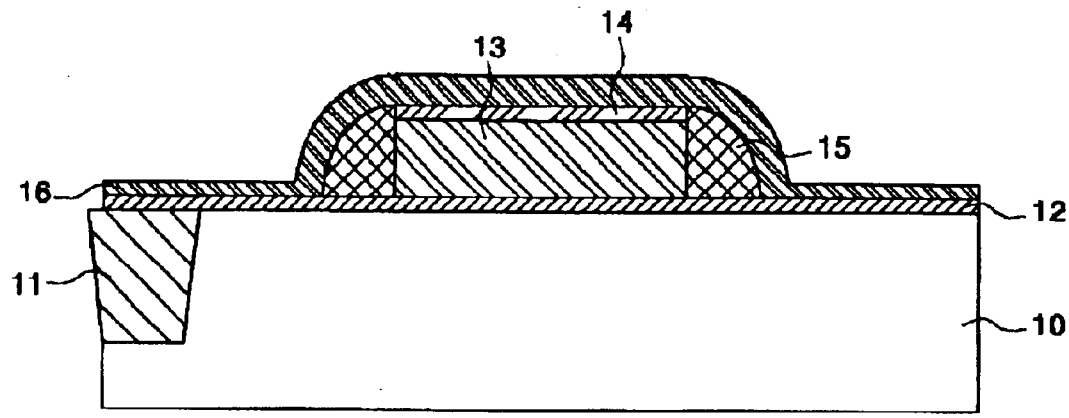
FIG. 1 is a cross-sectional view showing a NMOS transistor with a LDD structure formed in accordance with a prior art.

Preferred embodiments of the present invention will now be described with reference to the accompanying drawings. These embodiments are described by way of the example, and therefore these embodiments do not limit the scope of the present invention. In the following description, same drawing reference numerals are used for the same elements even in different drawings.

FIGS. 2a–2e are cross-sectional views showing a method for fabricating a CMOS transistor in accordance with a first embodiment of the present invention.

Figure 2A:
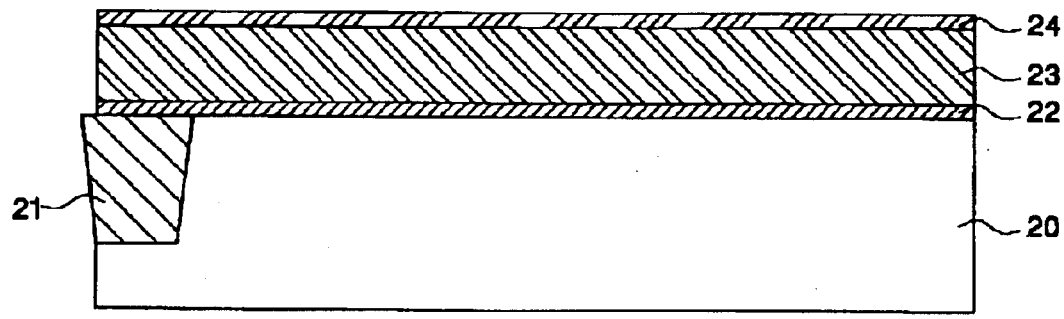
FIGS. 2a–2e are cross-sectional views showing a method for fabricating a CMOS transistor in accordance with a first embodiment of the present invention.

Referring to FIG. 2a, a device isolation layer 21 formed as a conventional method such as local oxidation of polysilicon (LOCOS), a shallow trench isolation (STI) and the like method is performed, an implant process is performed to form an N-well and a P-well. Thereafter, a gate oxide layer 22, a gate electrode 23 and an etching stop layer 24 are formed on the device isolation layer 21 and the semiconductor substrate 20 sequentially.

Figure 2B:
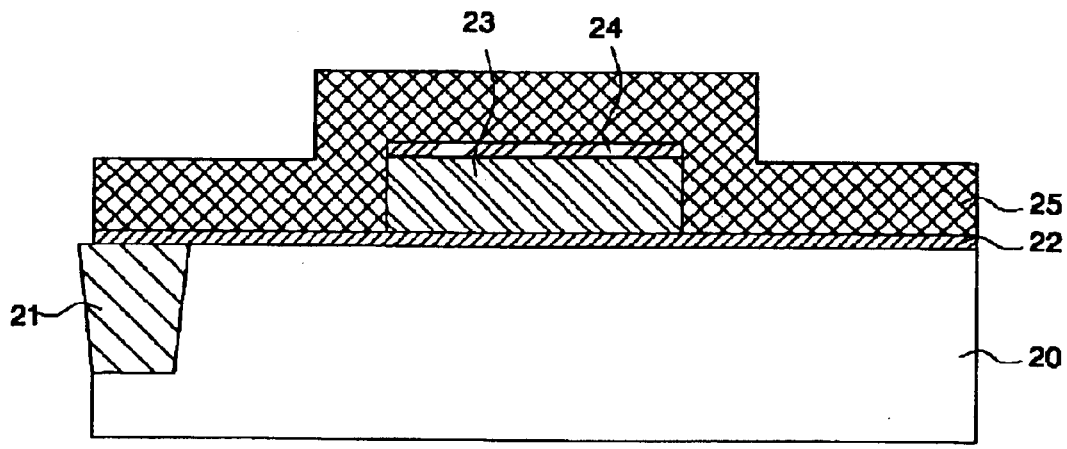

Referring to FIG. 2b, after the gate electrode 23 and the etching stop layer 24 are patterned into a predetermined configuration through a photomasking process and a dry etching process, an insulation layer 25 having a high etching ratio are deposited on the patterned etching stop layer 24 on the semiconductor substrate 20.

Figure 2C:
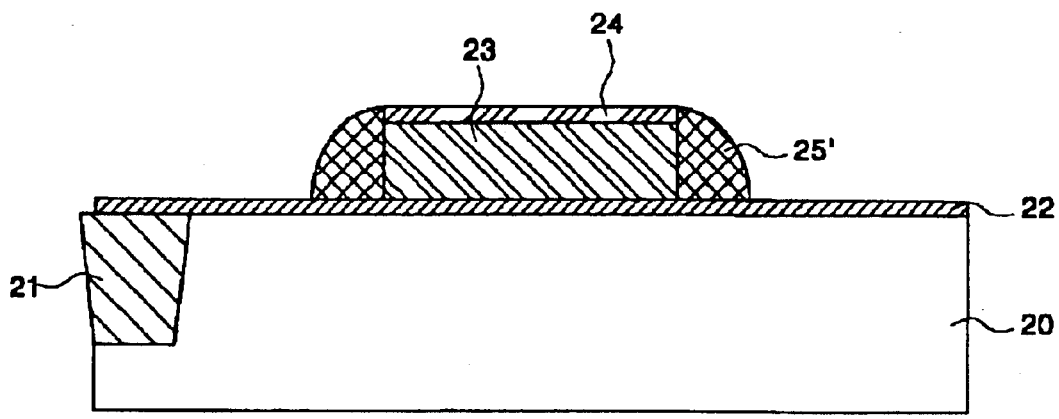

Referring to FIG. 2c, the insulating layer 25 is dry etched to form a side wall spacer 25' at a side wall of the gate electrode 23 and a source/drain 26 is formed on a predetermined region of the semiconductor substrate 20 place below the side wall spacer 25'.

Figure 2D:
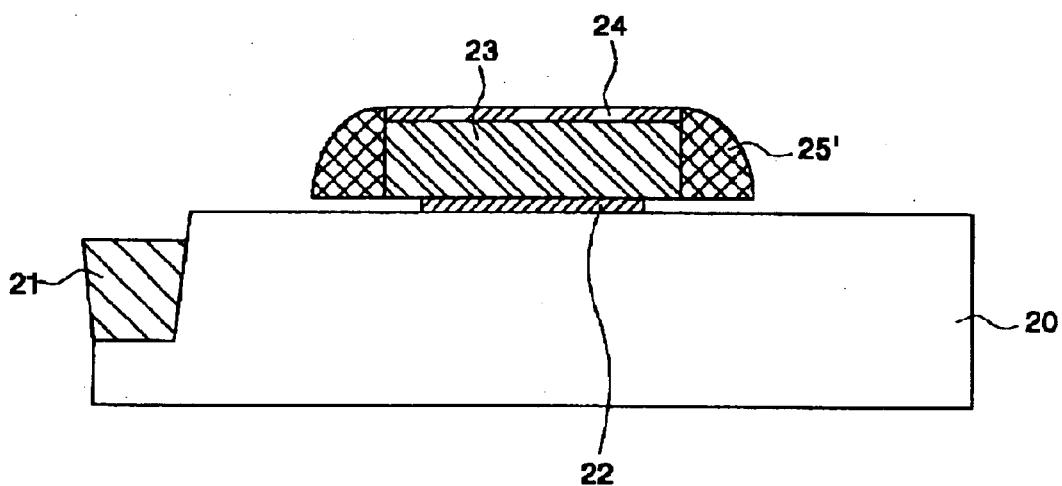

Referring to FIG. 2d, the gate oxide layer 22 placed around an edge of the gate is removed by using the side wall spacer 25' and the etching stop layer 24 of the gate (A) as an etching barrier layer.

Figure 2E:
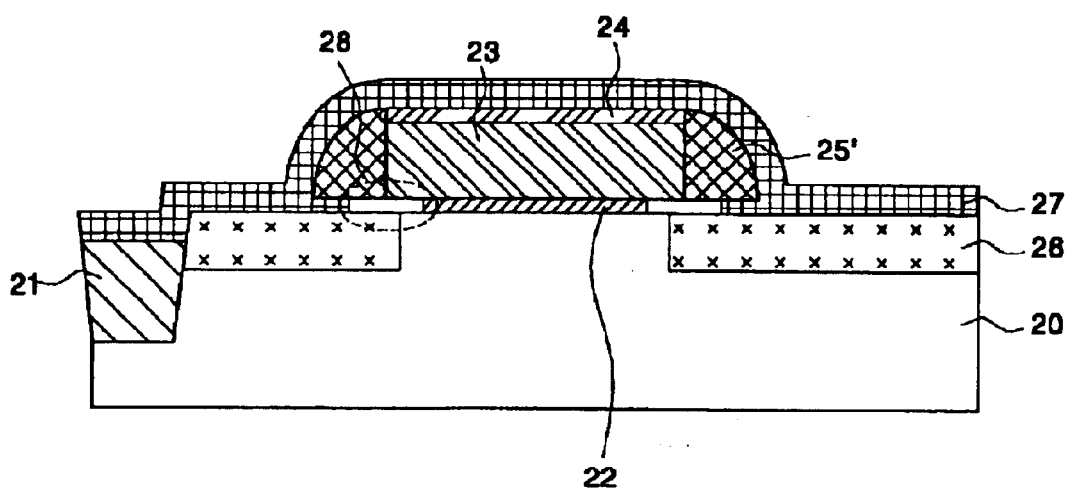

Referring to FIG. 2e, an interlayer insulating layer 27 is deposited on the patterned etching stop layer 24, the side wall spacer 25' and the semiconductor substrate 20 which is not covered by the patterned etching stop layer 24 and the side wall spacer 25'.

At this time, if the interlayer insulating layer 27 is made of a material such as tetra ethoxy silane (TEOS) with a low step coverage, a void 28 is formed an edge portion of the gate and this void 28 can be utilized as an insulator as with the gate oxide layer 22.

Therefore, hot electrons generated in the area of the void 28 tend to move toward the drain and this electrons penetrating through the area of the void 28 pass through the gate without being trapped by the gate oxide layer 22.

Figure 3A:
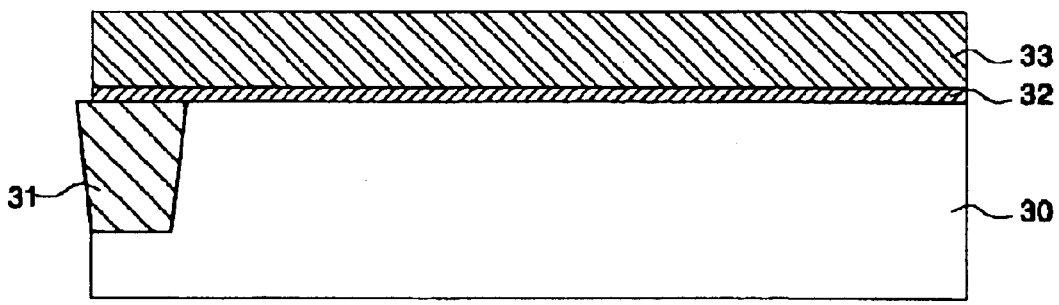
FIGS. 3a–3c show cross-sectional views showing a method for fabricating a CMOS transistor in accordance with a second embodiment of the present invention.
Figure 3B:
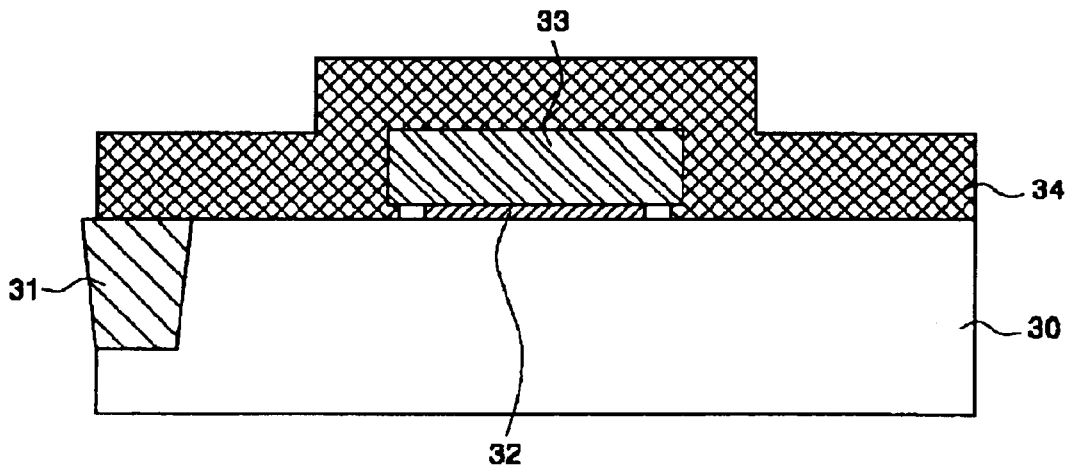
Figure 3C:
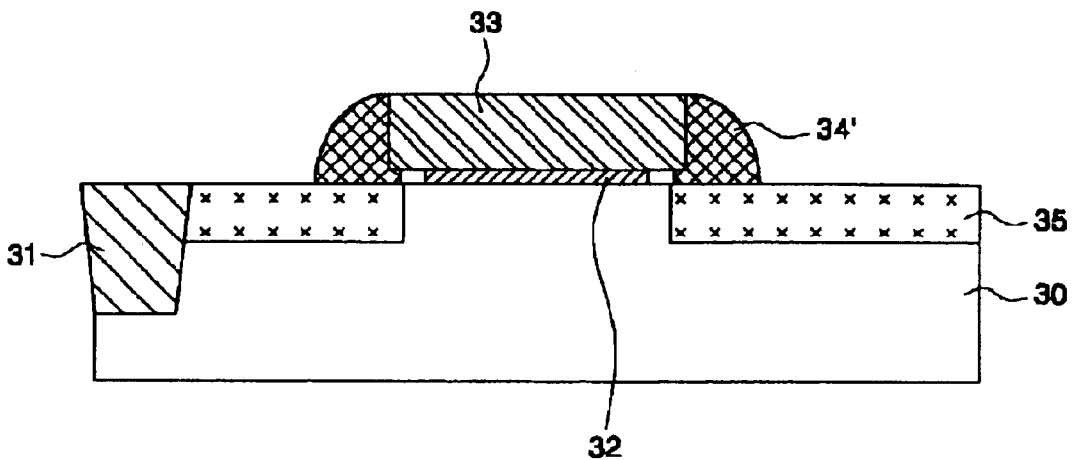

FIGS. 3a–3c show cross-sectional views showing a method for fabricating a CMOS transistor in accordance of a second embodiment of the present invention.

Referring to FIG. 3a, a device isolation layer 31 formed as a conventional method such as local oxidation of polysilicon (LOCOS), a shallow trench isolation (STI) and the like method is performed, an implant process is performed to form an N-well and a P-well. Thereafter, a gate oxide layer 32 and a gate electrode 33 are formed on the device isolation layer 31 and the semiconductor substrate 30 sequentially.

Referring to FIG. 3a, after the gate electrode 33 and the gate oxide layer 32 are patterned into a predetermined configuration, the gate oxide layer 32 placed at an edge portion of the gate is removed by wet etching. And then, an insulating layer 34 is formed on the patterned gate electrode 33 and the semiconductor substrate 30 which is not covered with the patterned gate electrode 33 to form a side wall spacer. In accordance with the preferred embodiment of the present invention, it is preferable that the insulating layer 34 has a high etching ratio. It should be noted that the insulating layer 34 may be deposited after patterning only the gate electrode 33 into the predetermined configuration and then removing the gate oxide layer 32 placed at an edge portion of the gate by a wet etching process using the gate electrode 33 as an etching mask.

Referring to FIG. 3c after a side wall spacer 34' is formed on a side wall of the patterned gate electrode 33 by etching the insulating layer 34, a source/drain 35 is formed in the semiconductor substrate 30 through an implant process.

As described above, the present invention has advantages in reducing manufacturing costs and time by not preceding a photomasking process and an implant process to form NMOS, PMOS and LDD structures. Also, the present invention can prevent a gate oxide layer from deteriorating from the use of a metal layer as a gate electrode material by eliminating an LDD oxidation process.

While the present invention has been described with respect to the preferred embodiments, other modifications and variations may be made without departing from the spirit and scope of the present invention as set forth in the following claims.

What is claimed is:

1. A method for fabricating a complementary metal oxide semiconductor (CMOS) of a semiconductor device, comprising the steps of:

forming a device isolation layer in a semiconductor substrate;

performing an implant process to the semiconductor substrate to form an N-well and P-well;

sequentially forming a gate oxide layer, a gate electrode and an etching stop layer on the semiconductor substrate;

patterning the gate electrode and the etching stop layer into a predetermined configuration;

depositing an insulating layer being a high etching ratio on the patterned etching stop layer and a portion of the semiconductor substrate which is not covered with the patterned etching stop layer;

etching the insulating layer to form a side wall spacer and to form a source/drain through an implant process;

removing the gate oxide layer placed around a gate edge through a wet etching process by using the side wall spacer and the etching stop layer as an etching barrier layer; and depositing an interlayer insulating layer on the patterned etching stop layer, the side wall spacer and a portion of the semiconductor substrate which is not covered with the patterned etching stop layer and the side wall spacer.

2. The method of claim 1, comprising performing a light oxidation process after etching the oxidation layer of the gate edge portion.

* * * * *